United States Patent

Asao et al.

(10) Patent No.: US 6,929,489 B2
(45) Date of Patent: Aug. 16, 2005

(54) ELECTRIC JUNCTION BOX

(75) Inventors: Takahiro Asao, Yokkaichi (JP); Shunji Taga, Yokkaichi (JP)

(73) Assignee: Sumitomo Wiring Systems, Ltd., Yokkaichi (JP)

(*) Notice: Subject to any disclaimer, the term of this patent is extended or adjusted under 35 U.S.C. 154(b) by 0 days.

(21) Appl. No.: 10/400,804

(22) Filed: Mar. 28, 2003

(65) Prior Publication Data

US 2003/0188882 A1 Oct. 9, 2003

(30) Foreign Application Priority Data

Apr. 8, 2002 (JP) .......................................... 2002-105253

(51) Int. Cl.[7] .............................................. H01R 13/44
(52) U.S. Cl. ......................... 439/140; 439/76.2; 439/949
(58) Field of Search ................................ 439/140, 136, 439/137, 141, 76.2, 949

(56) References Cited

U.S. PATENT DOCUMENTS

| | | | |
|---|---|---|---|
| 5,533,909 A | * | 7/1996 | Endo et al. ................. 439/381 |
| 5,879,201 A | | 3/1999 | Fukamachi et al. |
| 6,193,531 B1 | * | 2/2001 | Ito et al. ..................... 439/157 |
| 6,244,877 B1 | | 6/2001 | Asao |
| 6,283,769 B1 | | 9/2001 | Asao et al. |

* cited by examiner

Primary Examiner—Ross Gushi
(74) Attorney, Agent, or Firm—Greenblum & Bernstein, P.L.C.

(57) ABSTRACT

A tab protection member in a male connector housing on an outer surface of an electric junction box is moveable from a temporary engagement position to a final engagement position. The tab protection member is provided with tab through-holes and a closing plate section for closing an opening in the male connector housing. When the female connector housing is coupled to the male connector housing, the tab protection member is forcibly moved from the temporary engagement position to the final engagement position by the female connector housing and the tabs penetrate the tab through-holes, thereby coupling the tabs to terminals in the female connector housing.

12 Claims, 8 Drawing Sheets

ELECTRIC JUNCTION BOX

BACKGROUND OF THE INVENTION

1. Field of the Invention

The present invention relates to an electric junction box to be mounted on an automobile vehicle. More particularly, the present invention relates to an electric junction box that protects tabs that project from bus bars in a connector housing that is mounted on an outer surface of a casing, prior to the connector housing being coupled to a mating connector.

2. Description of Background Information

A conventional electric junction box will first be described with reference to FIG. 8. FIG. 8 is an exploded cross-sectional view of a conventional electric junction box.

As shown in FIG. 8, an electronic control unit (ECU) 5 is attached to a junction box 1 to be mounted on an automobile vehicle. When a conductor 6 of the ECU 5 is electrically connected to bus bars 3 contained in a casing 2 of the junction box 1, they are connected in the same manner as between bus bars and a wire harness.

In more detail, female terminals 7 are soldered to the conductor 6 of the ECU 5. The female terminals 7 are disposed in a female connector housing 8 mounted on a base plate of the ECU 5. On the other hand, tabs (i.e., male terminals) 3a bent from the bus bars 3 project into an interior portion of a male connector housing 4 that is provided on an outer surface of the casing 2. When the female connector housing 8 on the ECU 5 is inserted into the male connector housing 4, the tabs 3a are coupled to the female terminals 7, creating an electrical connection.

In the above structure, since the tabs 3a are not held at fixed positions in the interior of the male connector housing 4 before the female connector housing 8 is coupled to the male connector housing 4, the tabs 3a may become deformed or misaligned with respect to the female terminals 7 in the ECU 5, due to unintentional contact during, for example, shipping or assembly.

If the tabs become deformed, even if the male and female connector housings 4 and 8 are interconnected, the ECU 5 is not properly coupled to the junction box 1, since an end of the female connector housing 8 interferes with the deformed tabs 3a. That is, when deformed tabs are coupled to the ECU 5, a faulty connection will result.

Furthermore, if foreign matter becomes adhered to the tabs 3a in the male connector housing 4 prior coupling to the ECU 5, a short circuit may occur in one of the circuits in the ECU's 5 signal systems. This undesired event will result in function faults.

Whether connecting the bus bars to a wire harness in the junction box or connecting the bus bars to the ECU by a connector, the same undesirable consequences will occur with respect to the tabs projecting in the connector housing that is provided on the outer surface of the casing.

SUMMARY OF THE INVENTION

According to one aspect of the present invention, it is an object of the present invention is to provide an electric junction box that can protect tabs projecting in a connector housing provided outside a casing against interference with external parts in order to connect the tabs to a conductor or the like in the ECU until the connector housing is coupled to a mating connector housing.

To achieve the above object, the present invention is directed to an electric junction box. In the electric junction box, a male connector housing is provided on an outer surface of a casing. The male connector housing surrounds tabs extending from bus bars disposed within the casing. When a female connector housing is coupled to the male connector housing, terminals in the female connector housing are coupled to the tabs to make an electrical connection. The electric junction box includes a tab protection member disposed within an interior portion of the male connector housing so that the tab protection member can move from a temporary engagement position to a final engagement position. The tab protection member is provided with tab through-holes. The tab protection member also includes a closing plate section for closing an opening in the male connector housing, and an outer wall that surrounds the closing plate section. The tab protection member also is provided with pawls that engage temporary engagement protrusions extending from a peripheral wall of the male connector housing. When the female connector housing is coupled to the male connector housing, the tab protection member is forcibly moved from the temporary engagement position to the final engagement position by an end portion of the female connector housing as the tabs penetrate the tab through-holes. Consequently, the tabs are coupled to the terminals in the female connector housing.

As a result, the tabs projecting in the male connector housing are protected against contact with external parts by virtue of closing the opening in the male connector housing with the tab protection member at a position outside of the distal ends of the tabs.

Since the tab protection member contains the tab through-holes, the tab protection member is pushed into the male connector housing when the female connector housing is coupled to the male connector housing. Thus, the tabs penetrate the tab through-holes so that the tabs couple to the female terminals in the female connector housing.

Before interconnecting the male and female connector housings, since the tab protection member can protect the tabs projecting into the interior of the male connector housing, it is possible to prevent the tabs from being deformed by contact with external parts and to prevent foreign matter from adhering to the tabs.

As a result, the female connector housing will not interfere with the tabs upon connection of the male and female terminals and the male and female terminals can be correctly and reliably coupled to each other to create a certain electrical connection. It is also possible to prevent a short circuit, since the tabs are protected from contamination by foreign matter.

Further, it is not necessary to perform the additional steps of installing and later removing a tab protection member, since the tab protection member is moved from a temporary engagement position to a final engagement position.

The casing includes a junction box in which an ECU is attached to the casing. The terminals connected to a conductor of a base plate in the ECU are disposed in the female connector housing mounted on the base plate and the tab protection member is disposed in the male connector housing.

The junction box that mounts the ECU typically has many signal circuits. Foreign matter adhering to the tabs tend to create a short circuit between the various signal circuits. It would be desirable to prevent foreign matter from adhering to the tabs, to prevent short circuit between the circuits, to prevent connection faults and function faults in a vehicle, each in the name of improving the quality of components.

Preferably, the tab through-holes are tapered such that they are wider at a side in which the tabs are inserted. Thus, even if the tabs are slightly deformed or shifted from the regular engagement position, the tapered portions realign the tabs when the tabs penetrate the tab through-holes. A tab alignment function can efficiently and certainly couple the tabs to the terminals in the female connector housing.

According to another aspect of the present invention, an electric junction box is provided that includes a male connector housing included on an exterior surface of a casing that houses tabs (i.e., male terminals). Each of the tabs extend from a bus bar in the casing. A female connector housing is included that is adapted to couple to the male connector housing, creating an electrical connection between terminals in the female connector housing and the tabs. The electric junction box also includes a cover that has through-holes to receive each of the tabs and pawls to engage the male connector housing. The cover shifts from a first engagement position to a second engagement position when the female connector housing is coupled with the male connector housing and the tabs extend through the through-holes.

The cover may include a plate to close an opening in the male connector housing. The through-holes in the cover are tapered to facilitate alignment of the tabs and the terminals.

The electric junction box may also include an ECU that is attached to the casing of the junction box. Further, the terminals may be connected to a conductor of a base plate in the ECU, in which the female connector housing is mounted on the base plate.

According to another aspect of the present invention, a tab protection member is provided in an electric junction box that contains tabs disposed in a male connector housing that are coupleable to terminals in a female connector housing. The tab protection member includes a cover to close an opening in the male connector housing, which includes pawls to engage protrusions extending from the male connector housing and through holes to receive the tabs. The cover is shiftable from a temporary position to a final position when the female connector housing is coupled to the male connector housing and the tabs extend through the through holes. The through holes may be tapered to facilitate alignment of the tabs and the terminals, and may be wider at a side in which the tabs are inserted.

BRIEF DESCRIPTION OF THE DRAWINGS

The above and other objects, features and advantages of the present invention will be made apparent from the following description of the preferred embodiments, given as non-limiting examples, with reference to the accompanying drawings in which.

DETAILED DESCRIPTION OF THE PREFERRED EMBODIMENTS

Figure 1:
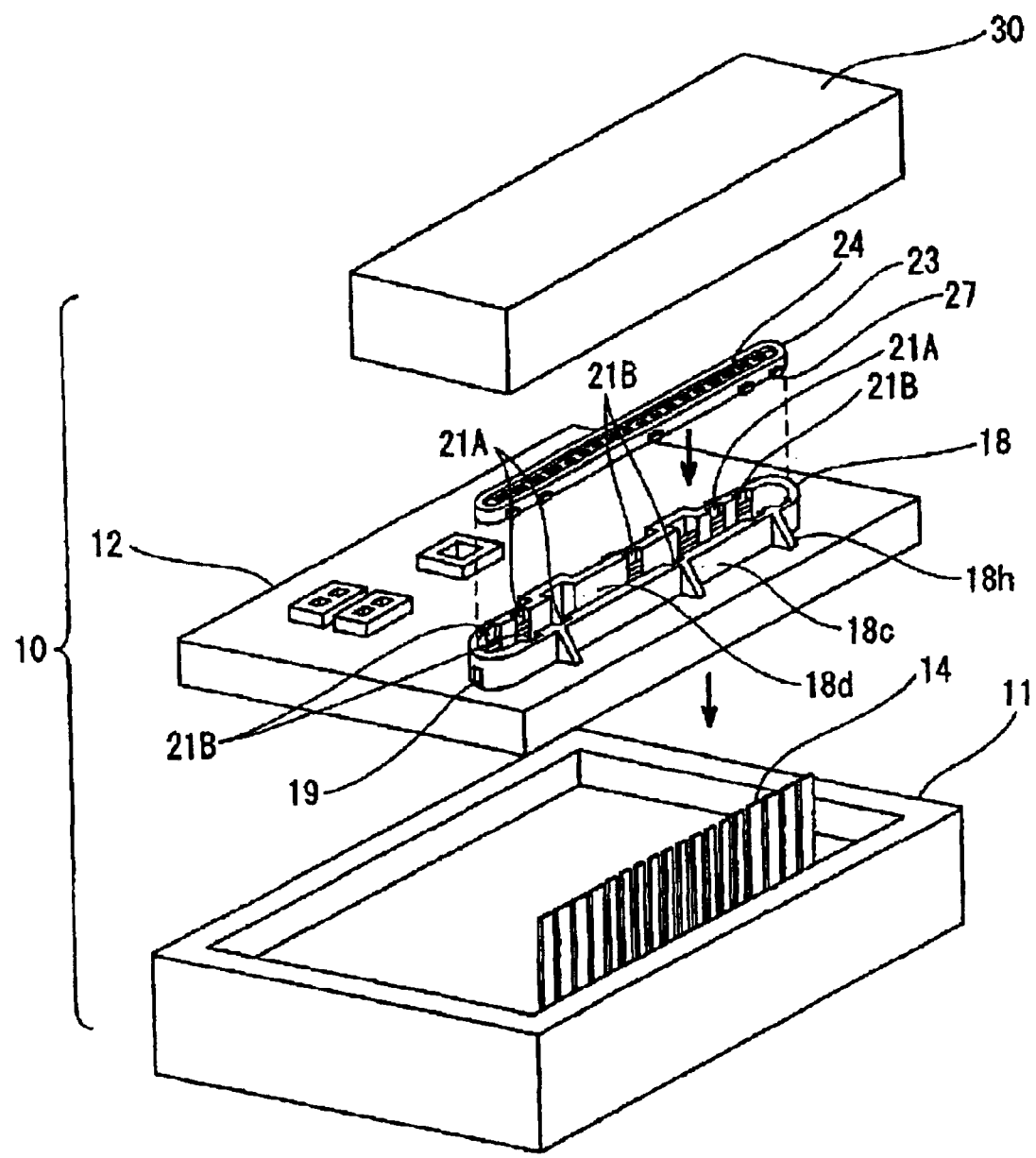
FIG. 1 is an exploded perspective view of a part of an electric junction box, according to an embodiment of the present invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

A preferred embodiment of the present invention will be described below with reference to the drawings.

FIGS. 1 to 7 show an embodiment of an electric junction box 10 in accordance with the present invention. The electric junction box 10 includes a lower casing 11 and an upper casing 12. Laminated bus bars 13 are disposed in the electric junction box 13. An electronic control unit (ECU) 30 is attached to the upper casing 12 of the electric junction box 10 after mounting the upper casing 12 onto the lower casing 11.

A male connector housing 18 is positioned on the upper surface of the upper casing 12. The male connector housing 18 includes a bottom wall 18b having juxtaposed terminal holes 18a and a peripheral wall 18c surrounding the bottom wall 18b. A plurality of tabs 14 extend in a bent arrangement from the bus bars 13 and protrude in parallel into an interior space defined between the bottom wall 18b and the peripheral wall 18c of the male connector housing 18. The male connector housing 18 has an opening 18d opposite the bottom wall 18b.

A plurality of tab guide protrusions 18f extend upward from the bottom wall 18b. Each tab guide protrusion 18f contains a tab through-hole 18g through which each tab 14 penetrates.

Triangular reinforcement members 18h are provided at various positions along the peripheral wall 18c of the male connector housing 18 and are integrated with an upper surface of the upper casing 12 to reinforce the peripheral wall 18c.

A tab protection member 23 is disposed in the male connector housing 18 and is capable of movement from a temporary engagement position P1 to a final engagement position P2.

Figure 3A:
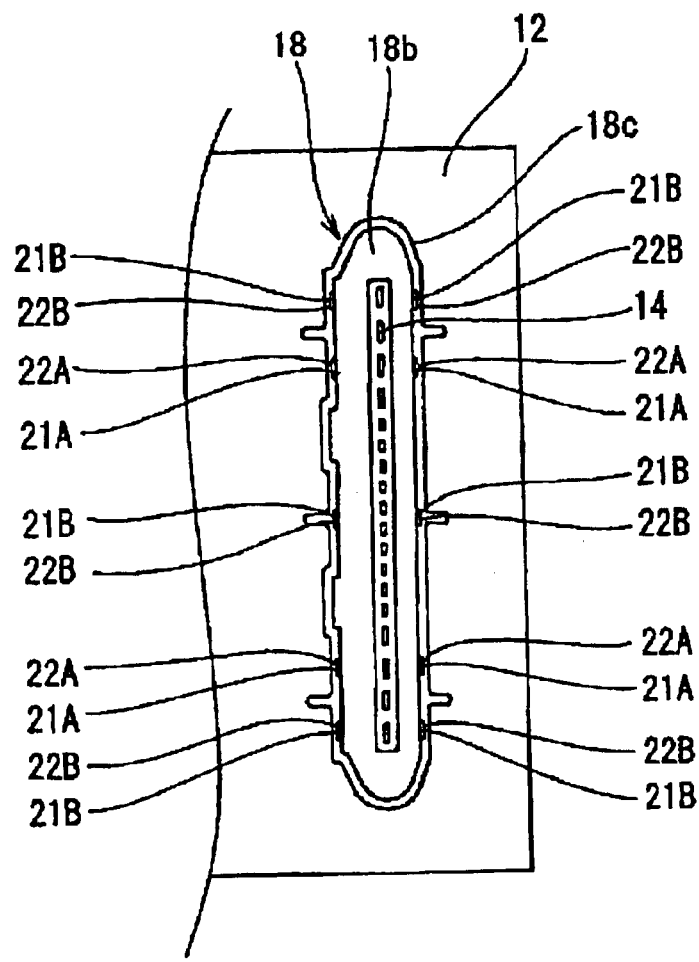
FIG. 3A is a plan view of a male connector housing provided in the electric junction box.
Figure 4A:
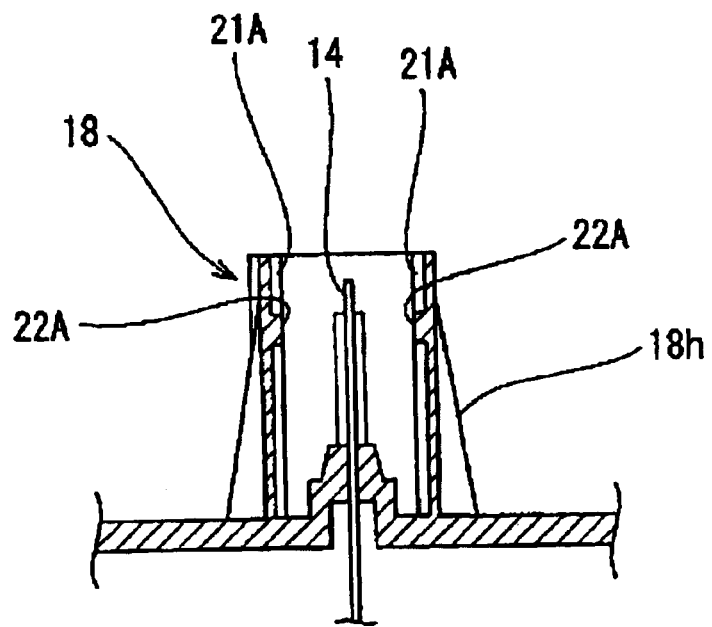
FIG. 4A is a cross-sectional view of the male connector housing at a first position.
Figure 4B:
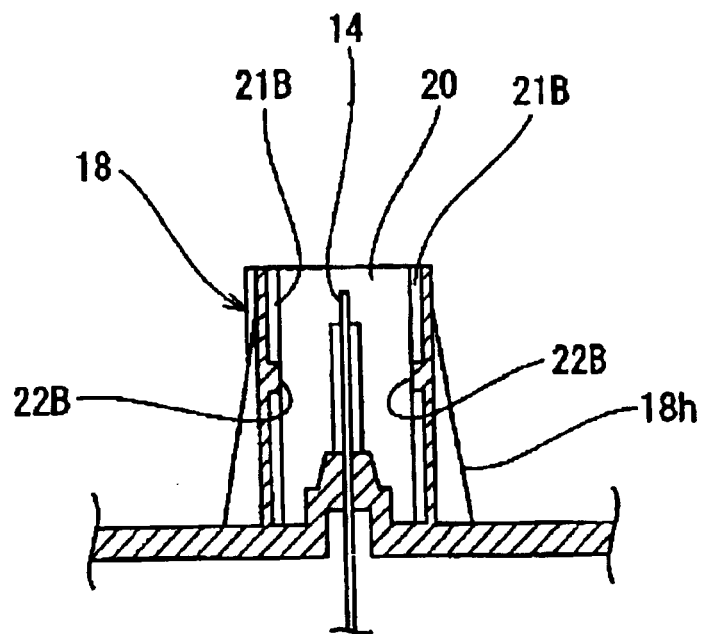
FIG. 4B is a cross-sectional view of the male connector housing at a second position.

As shown in FIGS. 3A, 4A and 4B, the peripheral wall 18c of the male connector housing 18 is provided on an inner surface with five pairs of guide grooves 21 (21A, 21B) extending vertically and opposing each other. Two pairs of guide grooves 21 A are provided, on intermediate portions thereof in the vertical direction, with first protrusions 22A to support a temporary engagement position. The other three pairs of guide grooves 21 B are provided, on intermediate portions below the first protrusions 22A in the vertical direction, with second protrusions 22B to support the temporary engagement position.

Figure 5A:
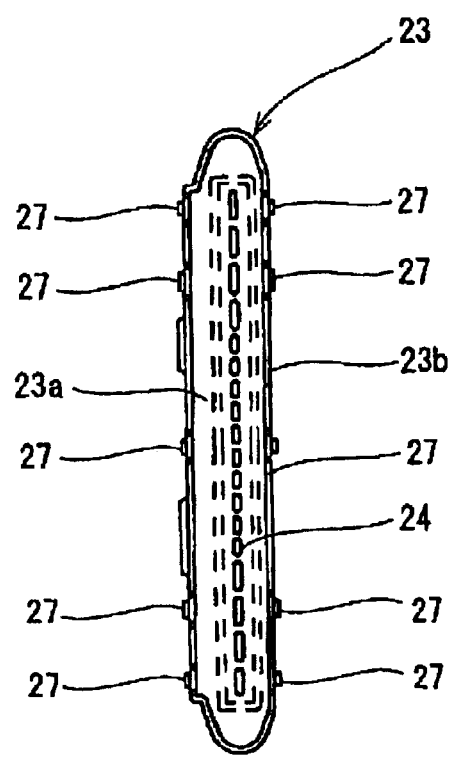
FIG. 5A is a plan view of a tab protection member.
Figure 5B:
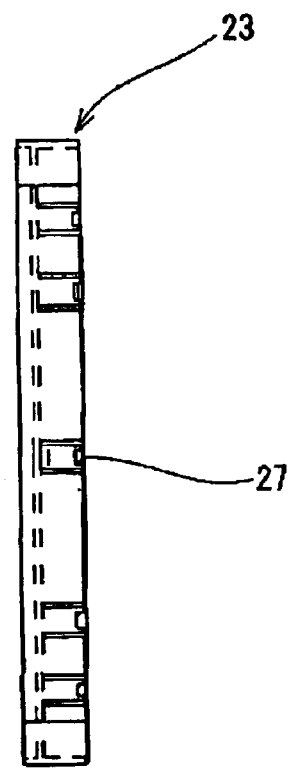
FIG. 5B is a front elevation view of a tab protection member.
Figure 5C:
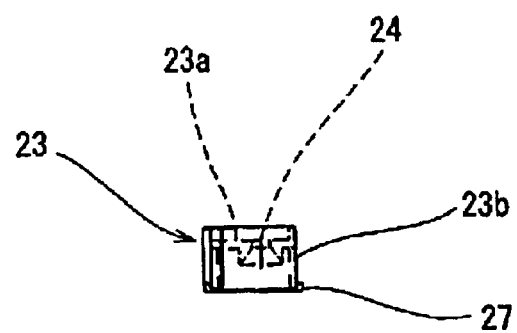
FIG. 5C is a side. elevation view of a tab protection member.

The tab protection member 23, as shown in FIGS. 5A and 5B, includes a closing plate section 23a that closes the opening 18d in the male connector housing 18 and further includes a peripheral wall section 23b that extends in an upward direction around the outer periphery of the closing plate section 23a. Tab through-holes 24 are provided in the closing plate section 23a in a parallel arrangement at positions corresponding to the juxtaposed tabs 14. The peripheral wall section 23b is adapted to come into contact with the inner surface of the peripheral wall 18c of the male connector housing 18. The peripheral wall section 23b is provided on an outer surface with pawls 27 that are arranged at positions corresponding to the five pairs of protrusions 22A and 22B.

Figure 6A:
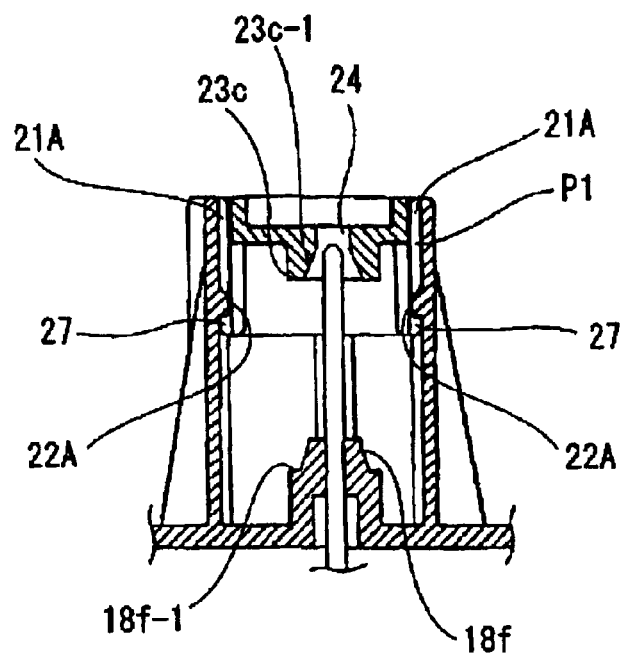
FIG. 6A is a cross-sectional view of the male connector housing of the electric junction box to which the tab protection member is temporarily attached, at a first position.
Figure 6B:
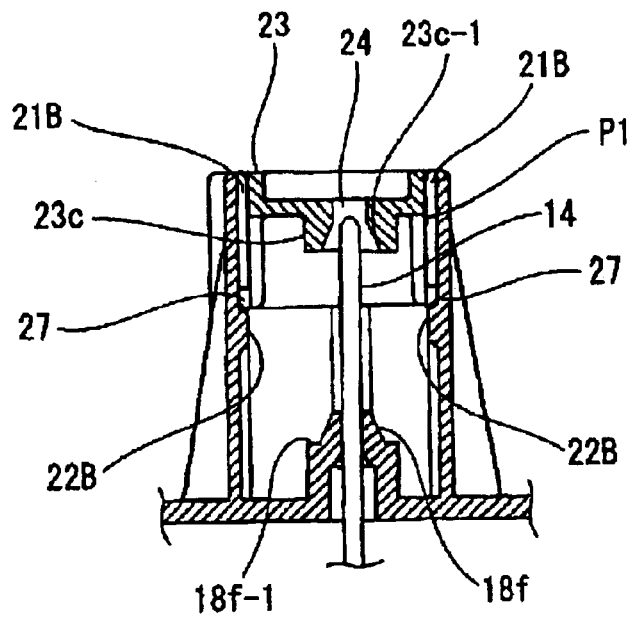
FIG. 6B is a cross-sectional view of the male connector housing of the electric junction box to which the tab protection member is temporarily attached, at a second position.

When the tab protection member 23 closes the opening 18d in the male connector housing 18, the pawls 27 are opposed to the guide grooves 21 A and 21 B and the tab protection member 23 is slightly pushed onto the male connector housing 18, as shown in FIGS. 6A and 6B. The pawls 27 in the guide grooves 21A slide over the first protrusions 22A while the pawls 27 in the guide grooves 21 B engage the second protrusions 22B. Consequently, the tab protection member 23 is retained at the temporary engagement position P1.

The closing plate section 23a of the tab protection member 23 is provided with fitting protrusions 23c that surround the tab through-holes 24. Each of the fitting protrusions 23c is provided on an inner surface with a tapered portion 23c-1 that widens in the downward direction. Accordingly, even if the tabs 14 are slightly deformed or have shifted from their original positions, the tapered portions 23c-1 correct any slight deformation or shifting of the tabs 14, when the tabs 14 penetrate the tab through-holes 24. Thus, the tabs 14 may be easily inserted into the tab through-holes 24.

Figure 7A:
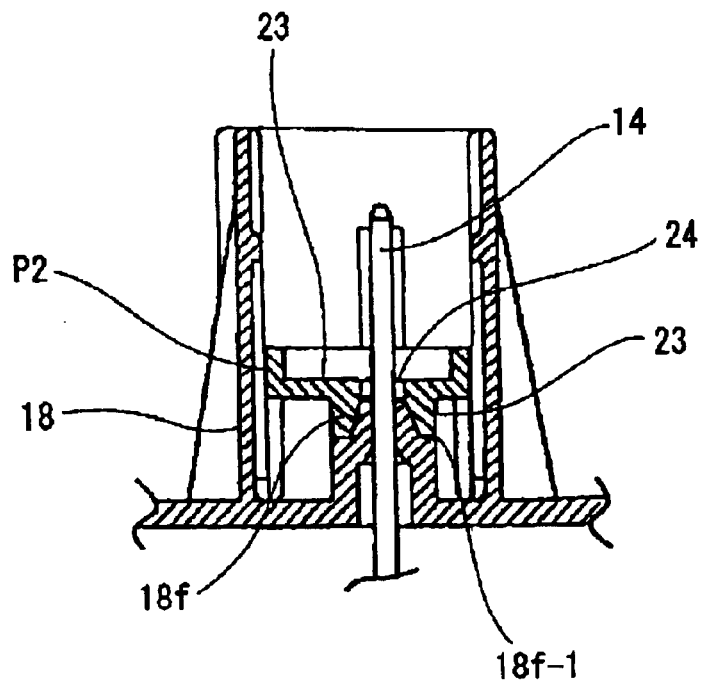
FIG. 7A is a cross-sectional view of the male connector housing of the electric junction box to which the tab protection member is regularly attached, at a first position.
Figure 7B:
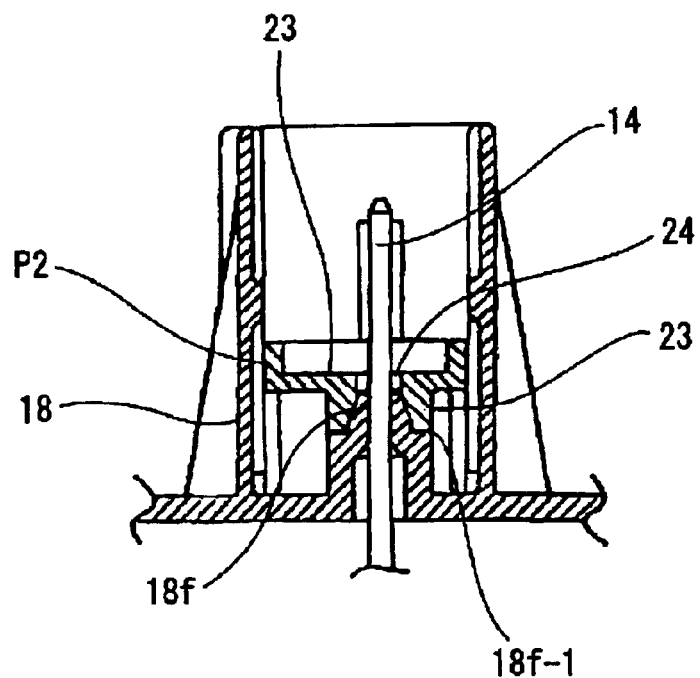
FIG. 7B is a cross-sectional view of the male connector housing of the electric junction box to which the tab protection member is regularly attached, at a second position.
Figure 8:
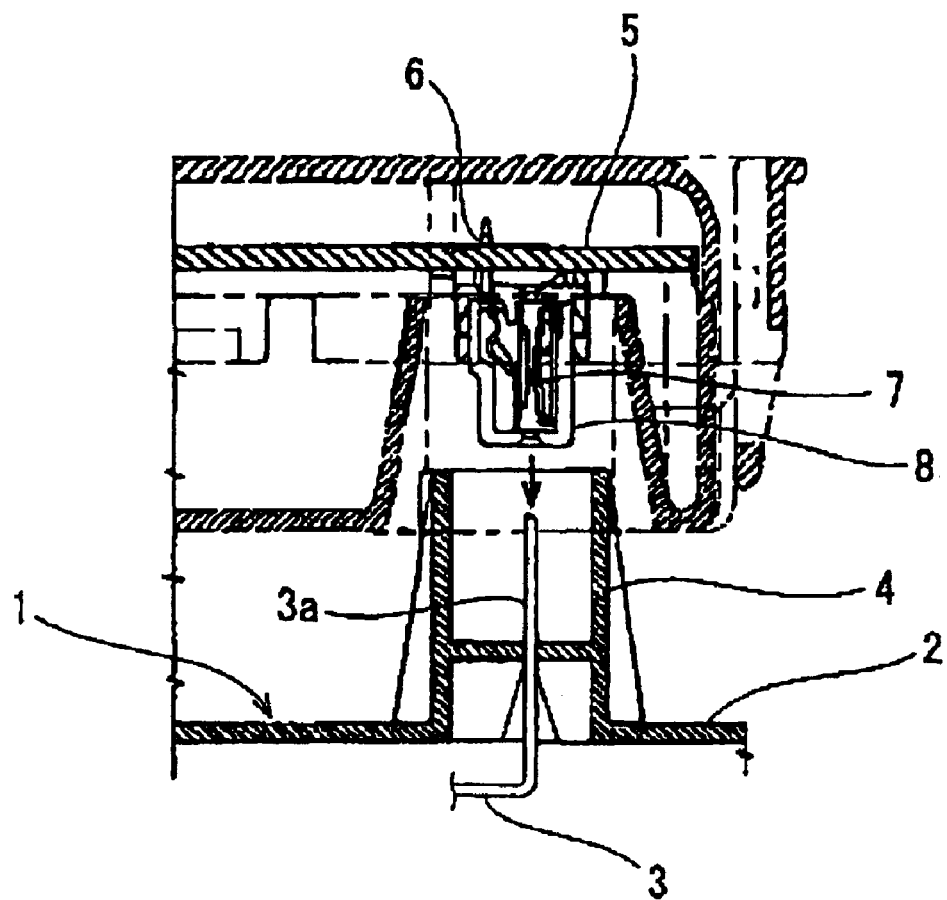
FIG. 8 is an exploded cross-sectional view of a conventional electric junction box.

When the tab protection member 23 is pushed further from the temporary engagement position P1 into the male connector housing 18, as shown in FIGS. 7A and 7B, the fitting protrusions 23c engage the tab guide protrusions 18f of the male connector housing 18 and distal ends of the fitting protrusions 23c come into contact with step portions 18f-1 of the tab guide protrusions 18f, thereby stopping the fitting protrusions 23c at a final engagement position P2.

As a result, since distal ends of the tabs 14 have already been correctly aligned in the tab through-holes 24 in the tab protection member 23 at the temporary engagement position P1, the tabs 14 can be reliably connected to female terminals 34 (FIG. 2). Thus, a certain electrical connection can be achieved.

Figure 3B:
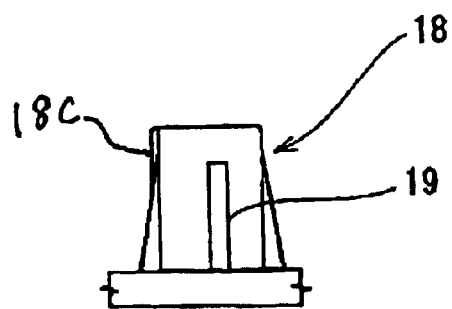
FIG. 3B is a front elevation view of a male connector housing provided in the electric junction box.

As shown in FIGS. 1 and 3B, the peripheral wall 18c of the male connector housing 18 is provided on longitudinally opposite ends with slits 19 extending upwardly from the bottom wall 18b. Thus, if the tab protection member 23 is inserted into the male connector housing 18 to an engaging position by mistake, during assembly for example, it is possible to release and remove the tab protection member 23 from the male connector housing 18 by inserting a suitable tool into the slits 19.

Figure 2A:
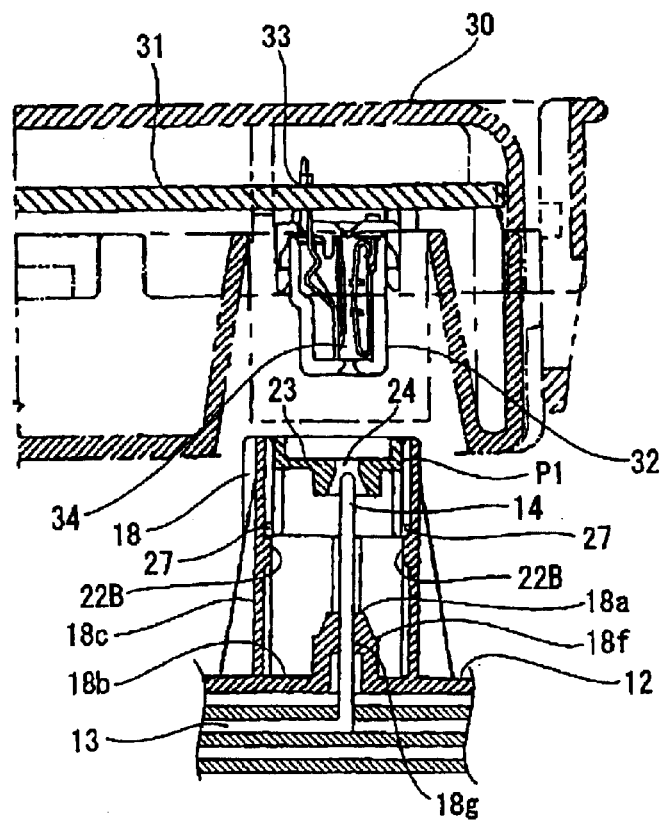
FIG. 2A is a cross-sectional view of a main part of the electric junction box, to which an ECU is not attached.

In the ECU 30, as shown in FIG. 2A, a female connector housing 32 is mounted on a base plate 31 so that the housing 32 extends downwardly. The female connector housing 32 contains female terminals 34 connected (e.g., soldered) to a conductor 33 on the base plate 31.

As described above, the tab protection member 23 is attached to an interior portion of the male connector housing 18 of the electric junction box 10. Some of the pawls 27 of the tab protection member 23 are supported on the upper surfaces of the second protrusions 22B while some of the other pawls 27 are held at the temporary engagement position P1 over the first protrusions 22A.

Figure 2B:
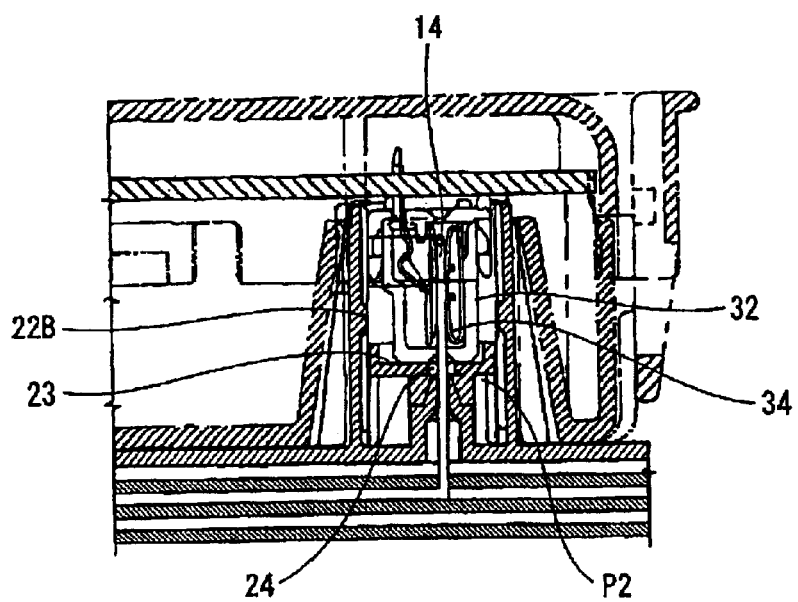
FIG. 2B is a cross-sectional view of a main part of the electric junction box to which an ECU is attached.

With the electric junction box 10, as shown in FIGS. 2A and 2B, the tab protection member 23 closes the opening 18d in the male connector housing 18 at a position outside of the distal ends of the tabs 14. Accordingly, it is possible to prevent the tabs 14 from being deformed by contact with external parts and prevent foreign matter from adhering to the tabs 14 prior to attaching the ECU 30 to the electric junction box 10.

When the female connector housing 32 of the ECU 30 is fitted in the male connector housing 18 of the electric junction box 10, they are readily coupled to each other by merely pushing the female connector housing 32 into the male connector housing 18, as shown in FIGS. 2A and 2B.

That is, by pushing the tab protection member 23 with the end surface of the female connector housing 32, the pawls 27 of the tab protection member 23 that engage the first protrusions 22A for temporary engagement are released from the first protrusions 22A and the tab protection member 23 is forcibly moved to the bottom of the male connector housing 18. Then, the fitting protrusions 23c engage the tab guide protrusions 18g at the final engagement position P2. When the tab protection member 23 is moving, the tabs 14 penetrate the tab through-holes 24 to couple to the female terminals 34.

Thus, the tab protection member 23 is released from the temporary engagement position P1 and moved to the bottom of the male connector housing 18 by merely inserting the female connector housing 32 into the male connector housing 18, without an additional step such as removing the tab protection member 23. Therefore, the tabs 14 and female terminals 34 may be effectively and efficiently connected.

Although the invention has been described with reference to an exemplary embodiment, it is understood that the words that have been used are words of description and illustration, rather than words of limitation. Changes may be made, within the purview of the appended claims, as presently stated and as amended, without departing from the scope and spirit of the present invention in its aspects. Although the invention has been described herein with reference to particular means, materials and embodiments, the invention is not intended to be limited to the particulars disclosed herein. Instead, the invention extends to all functionally equivalent structures, methods and uses, such as are within the scope of the appended claims.

The present disclosure relates to subject matter contained in priority Japanese Application No. 2002-105253, filed on Apr. 8, 2002, which is herein expressly incorporated herein by reference in its entirety.

What is claimed is:

1. An electric junction box in which a male connector housing is provided on an outer surface of a casing, said male connector housing surrounds tabs extending from bus bars disposed in said casing, a female connector housing is adapted to couple to said male connector housing, and terminals within said female connector housing connectable to said tabs to make an electrical connection, said junction box further comprising:

a tab protection member disposed in an interior of said male connector housing so that said tab protection member is moveable from a temporary engagement position to a final engagement position, said tab protection member being provided with tab through-holes provided along a central longitudinal axis of said tab protection member, a closing plate section to close an opening in said male connector housing, and an outer wall surrounding said closing plate section, said outer wall including a plurality of pawls engageable between a first plurality and a second plurality of temporary engagement protrusions extending from a peripheral wall of said male connector housing, said first plurality of temporary engagement protrusions being positioned at a first distance along said male connector housing and said second plurality of temporary engagement protrusions being positioned at a second distance along said male connector housing.

wherein when said female connector housing is coupled to said male connector housing, said tab protection member is forcibly moved from said temporary engagement position to said final engagement position by an end portion of said female connector housing and said tabs penetrate said tab through-holes, thereby coupling said tabs to said terminals in said female connector housing.

2. An electric junction box according to claim 1, further comprising an electronic control unit (ECU) attached to said casing of said junction box, wherein said terminals in said female connector housing are connected to a conductor of a base plate in said ECU, said female connector housing being mounted on said base plate, and said tab protection member is contained in said male connector housing on a side of said junction box.

3. An electric junction box according to claim 1, wherein said tab through-holes are tapered, being wider at a tab-inserting side.

4. An electric junction box according to claim 2, wherein said tab through-holes are tapered, being wider at a tab-inserting side.

5. An electric junction box that includes a male connector housing provided on an exterior surface of a casing containing a plurality of tabs, each of said tabs extending from a bus bar in said casing, and a female connector housing adapted to couple with said male connector housing to create an electrical connection between terminals in said female connector housing and said plurality of tabs, said junction box further comprising:

a cover having a plurality .of through-holes, provided along a central longitudinal axis of said cover, to receive each of said plurality of tabs and a plurality of pawls to engageable between a first plurality of protrusions and a second plurality of protrusions of said male connector housing in which said first plurality of protrusions are positioned at a first distance along said male connector housing and said second plurality of protrusions are positioned at a second distance along said male connector housing, said cover configured to shift from a first engagement position to a second engagement position when said female connector housing is coupled with said male connector housing and each of said plurality of tabs extends through said plurality of through-holes.

6. The electronic junction box according to claim 5, wherein said cover comprises a plate to close an opening in said male connector housing.

7. The electronic junction box according to claim 5, wherein said plurality of through-holes in said cover are tapered to facilitate alignment of said plurality of tabs and said terminals.

8. The electronic junction box according to claim 5, further comprising an electronic control unit (ECU) attached to said casing of said junction box.

9. The electronic junction box according to claim 8, wherein said terminals are connected to a conductor of a base plate in said ECU, and said female connector housing being mounted on said base plate.

10. A tab protection member usable in an electric junction box having a plurality of tabs disposed in a male connector housing that are coupleable to a plurality of terminals in a female connector housing, said tab protection member comprising:

a cover configured to close an opening in said male connector housing, said cover including a plurality of pawls engageable between a first plurality and a second plurality of protrusions, the first and second pluralities of protrusions extending from first and second positions of said male connector housing with respect to a direction of connection of said male and female connector housings and a plurality of through holes, provided along a central longitudinal axis of said cover, to receive said plurality of tabs, wherein said cover is shiftable from a temporary position to a final position when said female connector housing is coupled to said male connector housing and said plurality of tabs extend through said plurality of through holes.

11. The tab protection member according to claim 10, wherein said through holes are tapered to facilitate alignment of said plurality of tabs and the plurality of terminals.

12. The tab protection member according to claim 11, wherein said through holes are wider at a side in which said plurality of tabs are inserted.

* * * * *